United States Patent
El-Essawy et al.

(10) Patent No.: US 8,493,054 B2
(45) Date of Patent: Jul. 23, 2013

(54) CALIBRATION OF NON-CONTACT VOLTAGE SENSORS

(75) Inventors: Wael El-Essawy, Austin, TX (US); Alexandre Peixoto Ferreira, Austin, TX (US); Thomas Walter Keller, Austin, TX (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 230 days.

(21) Appl. No.: 13/159,568

(22) Filed: Jun. 14, 2011

(65) Prior Publication Data

US 2012/0319675 A1    Dec. 20, 2012

(51) Int. Cl.
*G01R 31/28* (2006.01)
*G01R 27/08* (2006.01)

(52) U.S. Cl.
USPC .................. 324/74; 324/76.11; 324/723

(58) Field of Classification Search
None
See application file for complete search history.

(56) References Cited

U.S. PATENT DOCUMENTS

| | | | |
|---|---|---|---|
| 5,473,244 A | 12/1995 | Libove et al. | |
| 6,661,239 B1 | 12/2003 | Ozick | |
| 6,708,126 B2 | 3/2004 | Culler et al. | |
| 6,825,649 B2 | 11/2004 | Nakano | |
| 6,909,291 B1 * | 6/2005 | Xu et al. | 324/601 |
| 6,940,291 B1 | 9/2005 | Ozick | |
| 7,068,045 B2 | 6/2006 | Zuercher et al. | |
| 7,098,644 B1 * | 8/2006 | Denison | 324/72.5 |
| 7,265,533 B2 | 9/2007 | Lightbody et al. | |
| 7,315,161 B2 | 1/2008 | Zribi et al. | |
| 7,330,022 B2 | 2/2008 | Bowman et al. | |
| 7,474,088 B2 | 1/2009 | Bowman et al. | |
| 7,493,222 B2 | 2/2009 | Bruno | |
| 7,546,214 B2 * | 6/2009 | Rivers et al. | 702/62 |
| 7,622,912 B1 | 11/2009 | Adams et al. | |
| 7,714,594 B2 | 5/2010 | Ibuki et al. | |
| 7,719,258 B2 | 5/2010 | Chen et al. | |
| 2008/0079437 A1 | 4/2008 | Robarge et al. | |
| 2009/0105973 A1 | 4/2009 | Choi et al. | |
| 2010/0001715 A1 | 1/2010 | Doogue et al. | |
| 2012/0265420 A1 * | 10/2012 | Bauerle et al. | 701/99 |

OTHER PUBLICATIONS

U.S. Appl. No. 13/024,199, filed Feb. 9, 2011, Carpenter, et al.
U.S. Appl. No. 13/024,181, filed Feb. 9, 2011, Carpenter, et al.

(Continued)

*Primary Examiner* — Jermele M Hollington
*Assistant Examiner* — Trung Nguyen
(74) *Attorney, Agent, or Firm* — Mitch Harris, Atty at Law, LLC; Andrew M. Harris; Eustus D. Nelson

(57) ABSTRACT

Calibration of a non-contact voltage sensor provides improved accuracy for measuring voltage on a conductor such as an AC branch circuit wire. In a calibration mode, a predetermined voltage is imposed on a first voltage sensing conductor integrated in the non-contact voltage sensor, while a voltage on a second voltage sensing conductor is measured using a circuit of predetermined input impedance. The capacitance between the wire and each of the voltage sensing conductors may be the same, so that in measurement mode, when the first and second voltage sensing conductors are coupled together, the effective series capacitance provided in combination with the predetermined input impedance is four times as great. The results of the voltage measurement made in the calibration mode can thereby be used to adjust subsequent voltage measurements made in measurement mode with the first and second voltage sensing conductors combined in parallel.

11 Claims, 4 Drawing Sheets

OTHER PUBLICATIONS

Dwyer, "A Self-Calibrating Miniature Hall Effect Solution to Gear Tooth Speed Sensing", downloaded from: http://saba.kntu.ac.ir/eecd/ecourses/instrumentation/projects/reports/speed/toothed%20rotor/toothrotor_files/main.htm on May 24, 2011.

Valuetesters.com on-line catalog: "non-contact voltage probes", downloaded from http://valuetesters.com/Voltage-Probe-Non-contact.php on May 24, 2011.

McKenzie, et al. "Non-contact Voltage Measurement using Electronically Varying Capacitance", Electronics Letters, Feb. 4, 2010, vol. 46, No. 3, UK.

Silicon Chip, "Current Clamp Meter Adapter for DMMs", issue 180, published Sep. 12, 2003.

Silicon Chip, "Compact 0-80A Automotive Ammeter", issue 165, pp. 1-12, downloaded from www.siliconchip.com.au/cms/A 03551/article.html Nov. 4, 2010, published Jun. 30, 2002.

Ziegler, et al., "Current Sensing Techniques: A Review", IEEE Sensors Journal, Apr. 2009, pp. 354-376 vol. 9, No. 4. Piscataway, NJ.

* cited by examiner

CALIBRATION OF NON-CONTACT VOLTAGE SENSORS

BACKGROUND OF THE INVENTION

1. Field of the Invention

The present invention is related to power measurement systems, and more specifically to calibration of a non-contact sensor that includes an electrostatic field sensor for detecting the phase and/or magnitude of a voltage on a wire of a power distribution system.

2. Description of Related Art

A need to measure power consumption in AC line powered systems is increasing due to a focus on energy efficiency for both commercial and residential locations. In order to provide accurate measurements, the characteristics of the load must be taken into account along with the current drawn by the load.

In order to determine current delivered to loads in an AC power distribution system, and in particular in installations already in place, current sensors are needed that provide for easy coupling to the high voltage wiring used to supply the loads, and proper isolation is needed between the power distribution circuits/loads and the measurement circuitry. Further, in order to determine the power consumption of an AC load, further information about the voltage supplied to the load is desirable, in particular the phase of the AC line voltage with respect to the measured current and in some instances, the magnitude of the AC line voltage. Therefore, sensors have been developed that include voltage sensing via electrostatic field measurement.

Non-contact current sensors provide for easy installation, circuit isolation and other advantages in power measurement systems. However, such sensors may vary in fabrication, installation and application and the relationship between the measured voltage phase and/or magnitude and the output of the sensor may not be well established.

Therefore, it would be desirable to provide techniques for calibrating non-contact voltage sensors and systems including such calibration.

BRIEF SUMMARY OF THE INVENTION

The invention is embodied in a calibration method and sensors and systems including calibration circuits and other calibration features that implement the techniques of the present invention.

The method and system select between a calibration mode and a measurement mode in a circuit connected to a non-contact voltage sensor. In the calibration mode, the system applies a predetermined voltage to a first voltage sensing conductor integrated within a housing of the non-contact voltage sensor and measures an electrostatic potential generated at a second voltage sensing conductor. In the measurement mode, the system couples both the first and second voltage sensing conductors in parallel and measures the voltage on the parallel combination as the electrostatic potential due to a wire inserted in the non-contact voltage sensor. The system corrects the measured voltage according to the measurement made in the calibration mode.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention encompasses voltage sensing systems and methods, as well as sensor devices that perform or are adapted for, calibration of a non-contact voltage sensor by using multiple voltage sensing conductors, at least one of which, in a calibration mode, is provided with a predetermined electrostatic potential, so that the voltage of at least one of the other voltage sensing conductors to obtain an indication of the coupling capacitance between the voltage sensing conductors and a wire for which the voltage will be measured during operation of the sensor. If the coupling capacitance between each voltage sensing conductor and the wire is equal, and the coupling between the voltage sensing conductors is negligible, then the coupling capacitances act in series during calibration and in parallel when the voltage sensing conductors are coupled in parallel during measurement of the electrostatic potential on the wire. By using a predetermined input impedance for the measurement circuit, the coupling capacitance can be determined and used to correct the measurement, providing a self-calibrating voltage sensor.

Figure 1A:
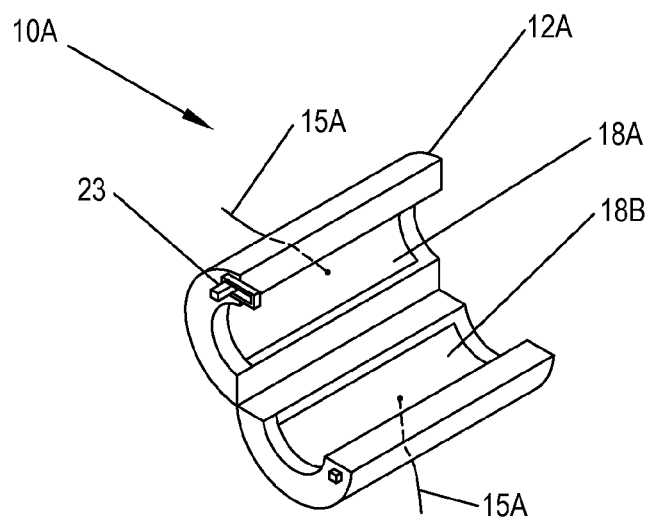
FIG. 1A and FIG. 1B are isometric views and FIG. 1C is a cross-section view of a sensor according to an embodiment of the present invention.
Figure 1B:
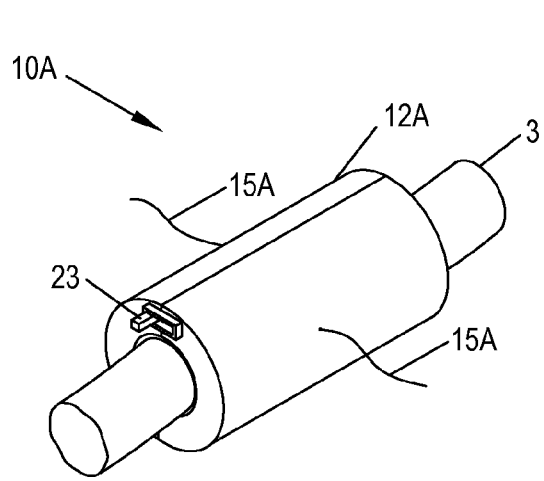
Figure 1C:
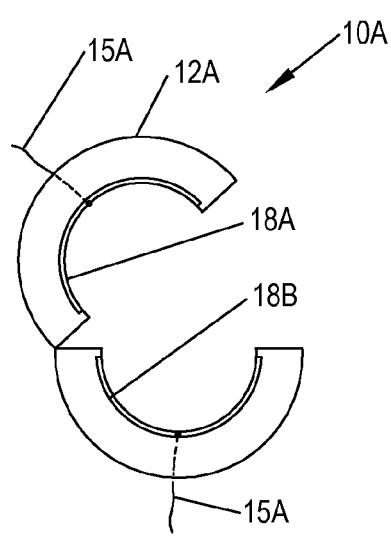

Referring now to FIGS. 1A-1C, a voltage sensor 10A, in accordance with an embodiment of the present invention, is shown. A plastic sensor body 12A encloses a pair of voltage sensing conductors 18A, 18B in the form of metal plates that provide information about a magnitude and phase of an electrostatic potential on a wire 3 around which sensor body is detachably secured as shown in FIG. 1B. A latch 23 secures a top portion and a bottom portion of sensor body 12A together, along with a hinge formed on sensor body 12A at an opposite side from latch 23. Voltage sensing conductors 18A, 18B are shown as having interface wires 15A connected to their metal plates and extending from sensor body 12A, but other types of terminals may be used as an alternative manner of providing connections to voltage sensing conductors 18A, 18B. The voltage sensing elements provide a calibrated AC waveform that is at least indicative of the phase of the voltage on wire 3 and in embodiments of the present invention calibrated to provide an indication of the magnitude of the voltage. FIG. 1C illustrates a cross section of sensor 10A showing details of voltage sensing conductors 18A, 18B within sensor body 12A. In the present invention, voltage sensing conductors 18A, 18B are used in a unique manner to provide self-calibration of voltage sensor 10A as will be described in further detail below.

Figure 2:
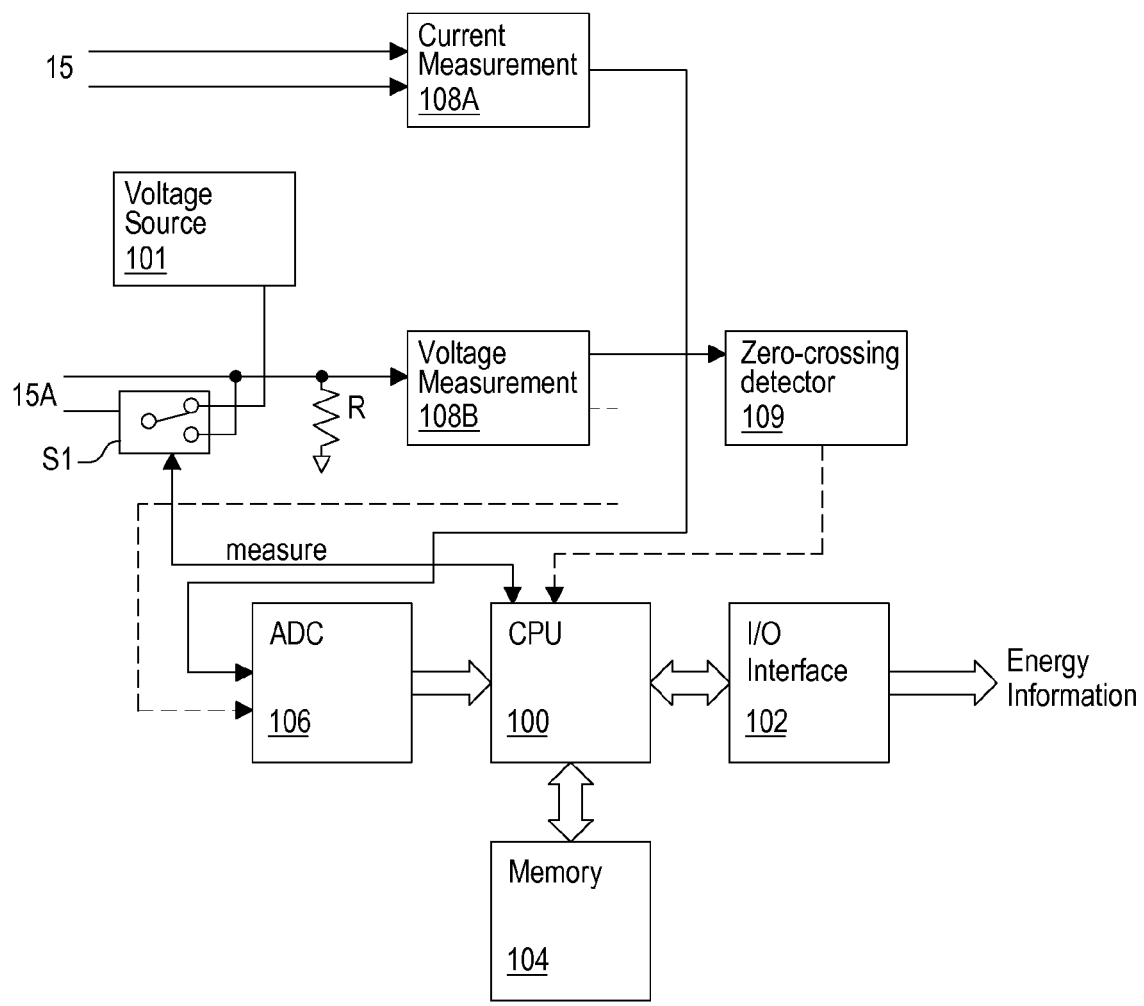
FIG. 2 is an electrical block diagram illustrating circuits for receiving inputs from sensors according to embodiments of the present invention.

Referring now to FIG. 2, a circuit in accordance with an embodiment of the invention is shown in a block diagram. The circuit of FIG. 2 implements a system for measuring the electrostatic potential of a wire that is inserted in one of voltage sensors 10A of FIGS. 1A-1C or other current sensors including voltage/current sensors 3A-3B and voltage sensors 4A-4B as described below. The output of a voltage measurement circuit 108A is provided as an input to an analog-to-digital converter (ADC) 106, which converts the current output waveform generated by current measurement circuit 108A to sampled values provided to a central processing unit (CPU) 100 that performs power calculations in accordance with program instruction stored in a memory 104 coupled to CPU 100. The voltage sensor wire 15A from one voltage sensing element of sensor 10A is provided to a selector S1 that is controlled by a control signal measure provided from CPU 100. When control signal measure is asserted, the circuit is in measurement mode, and the voltage sensor wire 15A coupled to selector S1 is coupled together with the other voltage sensor wire 15A and provided to an input of voltage measurement circuit 108B, which is an analog circuit that appropriately scales and filters the voltage channel output of the sensor. A zero-crossing detector 109 may be used to provide phase-only information to a central processing unit 100 that performs power calculations, alternatively or in combination with providing an output of voltage measurement circuit to an input of ADC 106. Alternatively, voltage measurement circuit 108B may be omitted and the corresponding output of selector S1 and one of voltage sensing conductors 15A connected directly to ADC 106.

When control signal measure is de-asserted, the circuit is in calibration mode, and the one of voltage sensor wires 15A coupled to selector S1 is coupled to a voltage source 101 that provides a predetermined voltage that is imposed on the voltage sensing conductor coupled to selector S1. Also in calibration mode, a voltage measurement is made to determine an indication of the electrostatic potential present on the voltage sensing conductor connected directly to voltage measurement circuit 108B that is caused by the predetermined voltage imposed on the other one of voltage sensor wires 15A connected to selector S1. A predetermined impedance is provided by a resistor R, which permits determining the capacitance between each of the voltage sensing conductors and wire 3 inserted in sensor 10A, and thus the parallel capacitance coupling wire 3 to the voltage measurement circuit 108B during measurement mode. An exemplary set of computations that calibrate sensor 10A for voltage measurements are given as:

$$V_{MEAS1}=V_{CAL} \cdot R_i/(R_i-j/2\omega C_c),$$

where $V_{CAL}$ is the predetermined calibration voltage generated by voltage source 101, $V_{MEAS}$ is the voltage measured on the other voltage sensing conductor 15A, $R_i$ is the resistance of resistor R and $C_c$ is the coupling capacitance between wire 3 and each of voltage sensing conductors 15A (including metal plates, and any other structures electrically connected to the voltage sensing conductors in the various embodiments). Since the coupling of the predetermined calibration voltage generated by voltage source 101 is assumed to be from one of voltage sensing conductors 15A to wire 3 to the other voltage sensing conductor 15A, the impedance of the series combination of the two coupling capacitances is $-j/2\omega C_c$. For the calibration to be performed as shown in the present example, the coupling capacitances between wire 3 and each of the voltage sensing conductors 15A must be equal. During measurement mode, the measured voltage is given by:

$$V_{MEAS2}=V_{WIRE} \cdot R_i/(R_i-2j/\omega C_c),$$

since the coupling capacitances between wire 3 and each of voltage sensing conductors are now acting in parallel and therefore have impedance $-2/\omega C_c$. Since $V_{WIRE}$ and $C_c$ are the only unknowns in the two equations given above, it is desirable to eliminate $C_c$ from the expression for $V_{WIRE}$, since $V_{WIRE}$ is the desired measurement result. Solving the first equation and the second equation for $C_c$ yields:

$$C_c=j2\omega(V_{MEAS1}/R_iV_{CAL}-R_i)=j\omega/2 \cdot (V_{MEAS1}/R_iV_{WIRE}-R_i), \text{ which}$$

leads to:

$$4 \cdot (V_{MEAS1}/R_iV_{CAL}-R_i)=(V_{MEAS1}/R_iV_{WIRE}-R_i) \text{ and}$$

$$4V_{MEAS1}/V_{CAL}-V_{MEAS2}/V_{WIRE}=3R_i^2$$

and finally to:

$$V_{WIRE}=V_{MEAS2}/(4V_{MEAS1}/V_{CAL}-3R_i^2).$$

Since the denominator of the equation above is constant, a calibration constant: $K=1/(4V_{MEAS1}/V_{CAL}-3R_i^2)$ can be computed at calibration time, and using the calibration constant, $V_{MEAS2}$ can be scaled by multiplying by K to obtain $V_{WIRE}$ directly.

Interface wires 15 from a current sensing element 17, if present, optionally provide input to a current measurement circuit 108A, which is an analog circuit that appropriately scales and filters the current channel output of the sensor. The output of current measurement circuit 108A is provided as an input to an analog-to-digital converter (ADC) 106, which converts the current output waveform generated by current measurement circuit 108A to sampled values provided to a central processing unit (CPU) 100 that performs power calculations in accordance with program instruction stored in a memory 104 coupled to CPU 104. Alternatively, current measurement circuit 108A may be omitted and current sensing element 17 may be connected directly to ADC 106. The power usage by the circuit associated with a particular current sensor can be determined by assuming that the circuit voltage is constant (e.g., 115 Vrms for electrical branch circuits in the U.S.) and that the phase relationship between the voltage and current is aligned (i.e., in-phase). However, while the assumption of constant voltage is generally sufficient, as properly designed properly distribution systems do not let the line voltage sag more than a small amount, e.g., <3%, the phase relationship between voltage and current is dependent on the power factor of the load, and can vary widely and dynamically by load and over time. Therefore, it is generally desirable to at least know the phase relationship between the branch circuit voltage and current in order to accurately determine power usage by the branch circuit. An input/output (I/O) interface 102 provides either a wireless or wired connection to a local or external monitoring system.

Once the system is calibrated, when power factor is not taken into account, the instantaneous power used by each branch circuit in a power distribution can be computed as:

$$P_{BRANCH}=V_{rms}*I_{meas}$$

where $V_{rms}$ is a constant value, e.g. 115V, and $I_{meas}$ is i a measured rms current value, such as an rms current value computed by the circuit of FIG. 2 from the calibrated current measurements described above. Power value $P_{BRANCH}$ may be integrated over time to yield the energy use. When the phase of the voltage is known, then the power may be computed more accurately as:

$$P_{BRANCH}=V_{rms}*I_{meas}*\cos(\Phi)$$

where Φ is a difference in phase angle between the voltage and current waveforms. The output of zero-crossing detector 109 may be compared with the position of the zero crossings in the current waveform generated by current measurement circuit 108A and the time ΔT between the zero crossings in the current and voltage used to generate phase difference Φ from the line frequency (assuming the line frequency is 60 Hz):

$$\Phi = 2\Pi * 60 * \Delta T$$

In general, the current waveform is not truly sinusoidal and the above approximation may not yield sufficiently accurate results. A more accurate method is to multiply current and voltage samples measured at a sampling rate much higher than the line frequency. The sampled values thus approximate instantaneous values of the current and voltage waveforms and the energy may be computed as:

$$\Sigma(V_n * I_n)$$

A variety of arithmetic methods may be used to determine power, energy and phase relationships from the sampled current and voltage measurements.

Figure 3A:
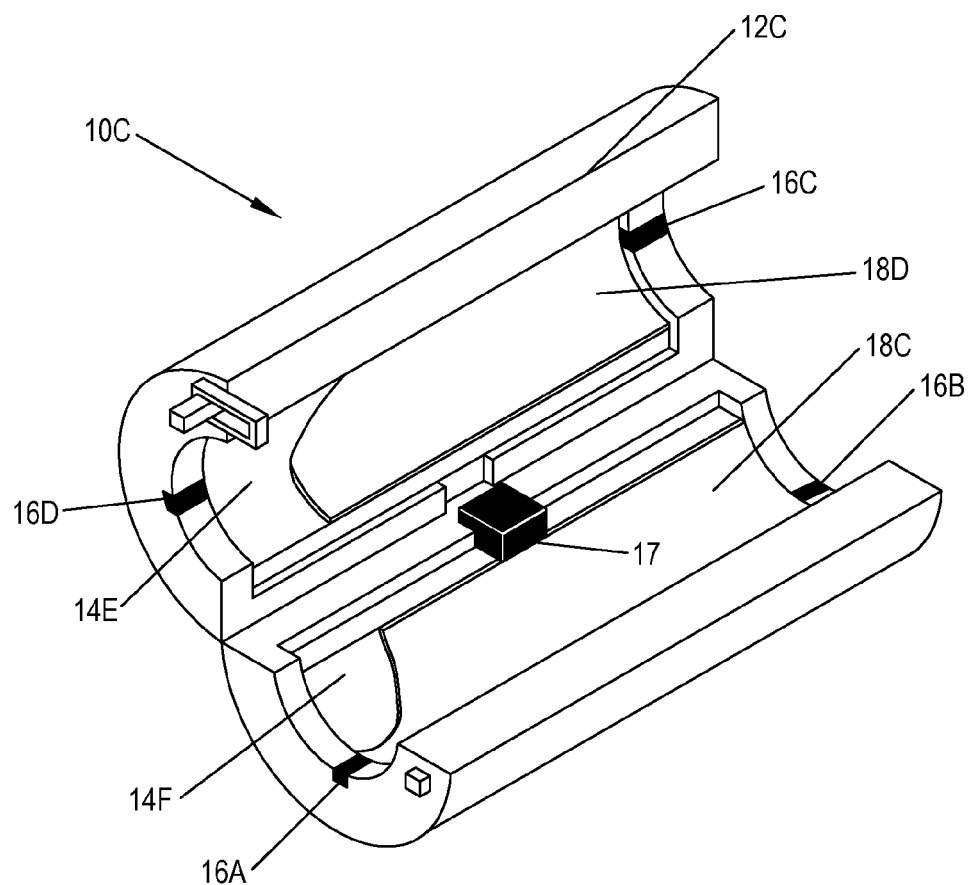
FIG. 3A is an isometric view and FIG. 3B is a cross-section view of a sensor according to another embodiment of the present invention.
Figure 3B:
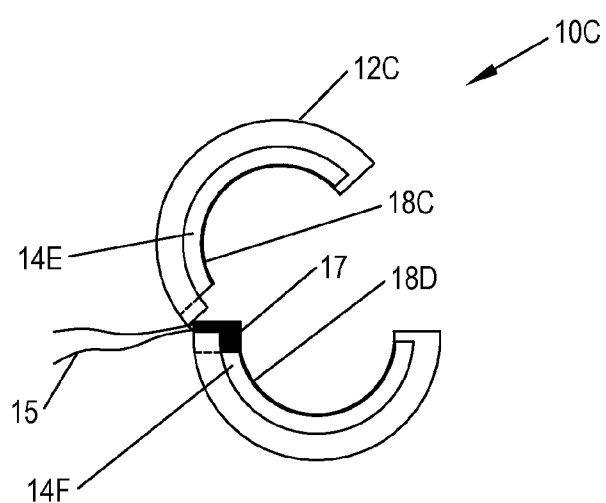

Referring now to FIGS. 3A and 3B, a sensor 10B in accordance with another embodiment of the invention is shown. Sensor 10B is similar to sensor 10A of FIGS. 1A-1C, so only differences between them will be described below. In sensor 10B, a current sensor is included. A current sensing portion of sensor 10B is formed by ferrite pieces 14E, 14F that form a ferrite cylinder around wire 3, when sensor body 12B is closed. Ferrite piece 14E, 14F half-cylinders with a gap between ferrite pieces 14E, 14F and in the circumference of the ferrite cylinder at the hinged portion of sensor body 12B. Current sensing element 17, which is generally a semiconductor magnetic field sensor, such as a Hall effect sensor, is disposed within the gap and thereby provides an output voltage indicative of the magnetic flux within the cylinder and corresponding to the net current passing through the central void of the cylinder. Therefore, the output of current sensing element provides a measure of the current in wire 3 shown in FIG. 1B, when inserted in sensor 10B of FIGS. 3A-3B. Metal plates 18C and 18D are disposed within ferrite current sensor portions 14E and 14F and provide capacitive coupling to wire 3 when disposed within current sensor 10B. Each of metal plates 18C and 18D include a separate set of terminals 16A, 16B and 16C, 16D, which are connected in parallel during measurement mode, while one set of terminals, e.g., terminals 16A and 16B are used to inject the predetermined calibration voltage during calibration mode, while terminals 16C and 16D remain coupled to the measurement circuits in order to determine the calibration constant. Metal plates 18E and 18F may be inserts mechanically secured by sensor shell 12B, or metal films bonded to or deposited on the interior surfaces of ferrite pieces 14E-14F.

Figure 4A:
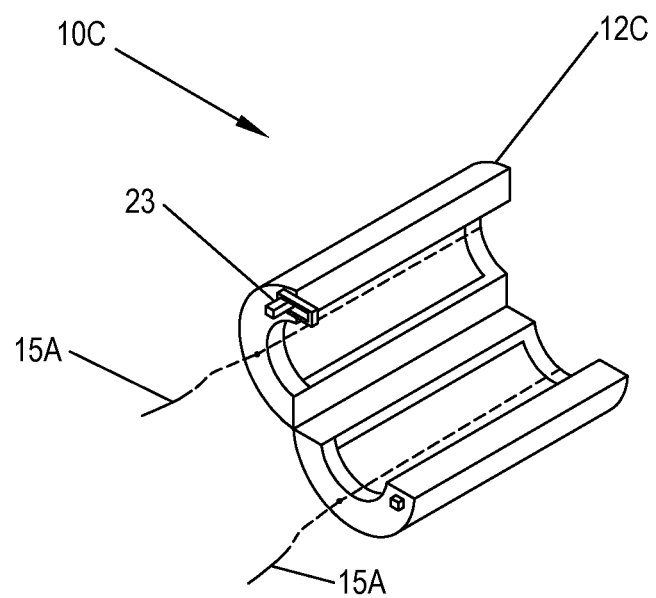
FIG. 4A is an isometric view and FIG. 4B is a cross-section view of a sensor according to yet another embodiment of the present invention.
Figure 4B:
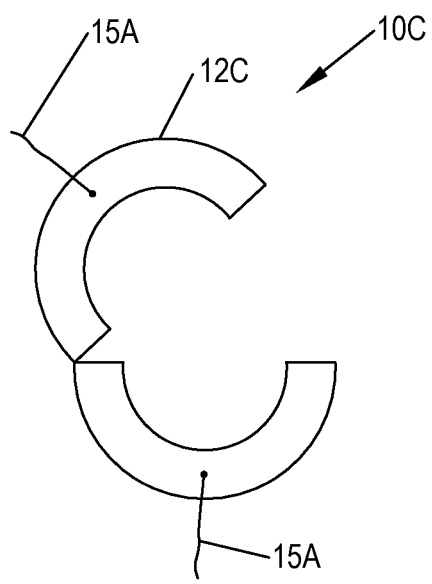

Referring now to FIGS. 4A and 4B, a voltage sensor 10C in accordance with yet another embodiment of the invention, is shown. Sensor 10C is similar to sensor 10A of FIGS. 1A-1C, so only differences between them will be described below. In sensor 10C, the voltage sensing conductors are provided by wires 15A embedded within plastic sensor body 12C and no metal plates are present, illustrating that the shape of the conductors used to provide voltage sensing can be of small area or large area without substantially reducing the effectiveness of the technique, as long as sufficient capacitance is available to provide the suitable coupling for the measurement signal-to-noise ratio.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A circuit, comprising:
   a voltage sensor having a housing for detachably coupling the sensor to a wire;
   a first voltage sensing conductor integrated in the housing for providing a first output indicative of a voltage on the wire, wherein the first voltage sensing conductor does not make electrical contact with the wire;
   a second voltage sensing conductor integrated in the housing for providing a second output indicative of the voltage on the wire, wherein the second voltage sensing conductor does not make electrical contact with the wire;
   a selector circuit coupled to the first voltage sensing conductor and coupled to the second voltage sensing conductor for selecting between a measurement mode and a calibration mode, wherein in the calibration mode, the selector circuit couples the first voltage sensing conductor to a voltage source that applies a calibration voltage of predetermined magnitude to the first voltage sensing conductor; and
   an AC voltage measuring circuit having an input with a predetermined input impedance coupled to the second voltage sensing conductor, wherein in the calibration mode, the AC voltage measuring circuit measures a voltage present on the second voltage sensing conductor to determine a voltage measurement calibration value, and wherein in measurement mode, the selector circuit couples the first voltage sensing conductor and the second voltage sensing conductor in parallel to the input of the AC voltage measuring circuit and measures a voltage present on parallel combination of the first voltage sensing conductor and the second voltage sensing conductor to obtain a voltage measurement value, and wherein the voltage measuring circuit adjusts the voltage measurement value in conformity with the voltage measurement calibration value.

2. The circuit of claim 1, wherein the first voltage sensing conductor and the second voltage sensing conductor have substantially equal capacitance to the wire, wherein the AC voltage measuring circuit determines a series capacitance value representing a sum of a first capacitance between the first voltage sensing conductor and the wire and a second capacitance between the second voltage sensing conductor and the wire, and wherein the voltage measurement circuit adjusts the voltage measurement value according to a parallel capacitance value determined by dividing the series capacitance value by a factor of four.

3. The circuit of claim 1, wherein the voltage measuring circuit comprises:
   an analog to digital converter having an input for receiving the first output from the current sensing device; and
   a processing circuit for executing program instructions that adjust the voltage measurement value in conformity with the voltage measurement calibration value.

4. The circuit of claim 1, wherein the predetermined impedance is a predetermined resistance of a resistor coupled in parallel with the input of the AC voltage measurement circuit and ground.

5. The circuit of claim 1, wherein the predetermined impedance is a predetermined shunt impedance of a capacitor coupled in parallel with the input of the AC voltage measurement circuit and ground.

6. The circuit of claim 1, wherein the housing is a cylindrical housing forming a clamshell from two half-cylinder housing portions coupled by a hinge, wherein the first voltage sensing conductor and the second voltage sensing conductor are conductive metal half-cylinders disposed within corresponding housing portions.

7. The circuit of claim 1, further comprising a non-contact current sensor for sensing a current flowing in the wire, wherein the non-contact current sensor comprises:
at least two ferrite cylinder portions disposed within the housing, wherein when the housing is coupled to the wire, the wire passes through a central void defined by the ferrite cylinder portions extending through a central axis thereof, and wherein a gap is defined along a circumference of a cylinder formed by the ferrite cylinder portions; and
a semiconductor magnetic field sensor disposed within the gap, wherein the first output is a voltage output of the semiconductor magnetic field sensor.

8. The circuit of claim 7, wherein the first voltage sensing conductor and the second voltage sensing conductor are conductive metal half-cylinders having a radius smaller than and disposed within corresponding ones of the ferrite cylinder portions.

9. The circuit of claim 8, wherein the conductive metal half-cylinders are metal layers deposited to or affixed to the corresponding ferrite cylinder portions.

10. The circuit of claim 1, wherein the housing is a cylindrical housing forming a clamshell from two half-cylinder housing portions coupled by a hinge, wherein the first voltage sensing conductor and the second voltage sensing conductors are wires affixed to corresponding housing portions at positions equidistant from a central void for accepting the wire and that is formed when the housing is closed.

11. A circuit, comprising:
a voltage sensor having a cylindrical housing forming a clamshell from two half-cylinder housing portions coupled by a hinge, for detachably coupling the voltage sensor to a wire;
a first voltage sensing conductor forming a half-cylinder plate integrated a corresponding one of the half-cylinder housing portions for providing a first output indicative of a voltage on the wire, wherein the first voltage sensing conductor does not make electrical contact with the wire;
a second voltage sensing conductor forming a half-cylinder plate integrated a corresponding one of the half-cylinder housing portions for providing a second output indicative of the voltage on the wire, wherein the second voltage sensing conductor does not make electrical contact with the wire;
a selector circuit coupled to the first voltage sensing conductor and coupled to the second voltage sensing conductor for selecting between a measurement mode and a calibration mode, wherein in the calibration mode, the selector circuit couples the first voltage sensing conductor to a voltage source that applies a calibration voltage of predetermined magnitude to the first voltage sensing conductor; and
an AC voltage measuring circuit having an input with a predetermined input impedance coupled to the second voltage sensing conductor, wherein in the calibration mode, the AC voltage measuring circuit measures a voltage present on the second voltage sensing conductor to determine a voltage measurement calibration value, and wherein in measurement mode, the selector circuit couples the first voltage sensing conductor and the second voltage sensing conductor in parallel to the input of the AC voltage measuring circuit and measures a voltage present on parallel combination of the first voltage sensing conductor and the second voltage sensing conductor to obtain a voltage measurement value, and wherein the voltage measuring circuit adjusts the voltage measurement value in conformity with the voltage measurement calibration value, wherein the first voltage sensing conductor and the second voltage sensing conductor have substantially equal capacitance to the wire, and wherein the voltage measurement circuit adjusts the voltage measurement value according to an increase in the capacitance acting in series with the predetermined input impedance by a factor of four when the measurement mode is selected.

* * * * *